United States Patent
Kim et al.

(10) Patent No.: US 10,833,662 B2
(45) Date of Patent: Nov. 10, 2020

(54) DELAY CELL AND DELAY LINE HAVING THE SAME

(71) Applicant: SK hynix Inc., Gyeonggi-do (KR)

(72) Inventors: Ja-Young Kim, Gyeonggi-do (KR); Hyun-Ju Ham, Gyeonggi-do (KR)

(73) Assignee: SK hynix Inc., Gyeonggi-do (KR)

( * ) Notice: Subject to any disclaimer, the term of this patent is extended or adjusted under 35 U.S.C. 154(b) by 0 days.

(21) Appl. No.: 16/578,812

(22) Filed: Sep. 23, 2019

(65) Prior Publication Data

US 2020/0204168 A1 Jun. 25, 2020

(30) Foreign Application Priority Data

Dec. 24, 2018 (KR) .................. 10-2018-0168379

(51) Int. Cl.
| | |
|---|---|
| H03K 5/13 | (2014.01) |
| H03K 3/356 | (2006.01) |
| H03H 11/26 | (2006.01) |
| H03K 5/133 | (2014.01) |
| H03L 7/081 | (2006.01) |
| H03K 5/00 | (2006.01) |

(52) U.S. Cl.
CPC ............. *H03K 5/133* (2013.01); *H03H 11/26* (2013.01); *H03L 7/0814* (2013.01); *H03L 7/0818* (2013.01); *H03K 2005/00058* (2013.01); *H03K 2005/00123* (2013.01); *H03K 2005/00156* (2013.01)

(58) Field of Classification Search
CPC ......... H03K 5/133; H03K 2005/00156; H03K 2005/00058; H03K 2005/00123; H03L 7/0814; H03L 7/0818; H03H 11/26
See application file for complete search history.

(56) References Cited

U.S. PATENT DOCUMENTS

| | | | | |
|---|---|---|---|---|
| 8,436,670 | B2 * | 5/2013 | Ma ........................ | G11C 7/222 327/276 |
| 2013/0051166 | A1 * | 2/2013 | Ma ........................ | G11C 7/222 365/194 |
| 2017/0170646 | A1 | 6/2017 | Srivastava et al. | |

* cited by examiner

*Primary Examiner* — Kenneth B Wells
(74) *Attorney, Agent, or Firm* — IP & T Group LLP

(57) ABSTRACT

A delay cell includes: a plurality of delay elements coupled in series; and at least one three-phase inverter that is coupled in parallel to at least one of the delay elements, and that receives through a first control terminal a first bias voltage for compensating for a variation of a power source voltage, and receives through a second control terminal a second bias voltage for compensating for a variation of a ground voltage.

22 Claims, 13 Drawing Sheets

FIG. 10

| # of UD | S<1:n> | NBIAS/PBIAS<1> | NBIAS/PBIAS<2> | NBIAS/PBIAS<3> | ... | NBIAS/PBIAS<n> |
|---|---|---|---|---|---|---|
| 1 | 1000...0000 | NBASE/PBASE | VSS/VDD | VSS/VDD | ... | VSS/VDD |
| 2 | 1100...0000 | NBASE/PBASE | NBASE/PBASE | VSS/VDD | ... | VSS/VDD |
| 3 | 1110...0000 | NBASE/PBASE | NBASE/PBASE | NBASE/PBASE | ... | VSS/VDD |
| ... | ... | ... | ... | ... | ... | ... |
| N | 1111...1111 | NBASE/PBASE | NBASE/PBASE | NBASE/PBASE | ... | NBASE/PBASE |

DELAY CELL AND DELAY LINE HAVING THE SAME

CROSS-REFERENCE TO RELATED APPLICATION

The present application claims priority of Korean Patent Application No. 10-2018-0168379, filed on Dec. 24, 2018, which is incorporated herein by reference in its entirety.

BACKGROUND

1. Field

Various embodiments of the present invention relate to a semiconductor design technology, and more particularly, to a delay line including a plurality of delay cells.

2. Description of the Related Art

The delay line is a circuit for outputting an input signal after delaying the output signal by a desired delay time. In general, the delay line may be formed of a plurality of delay cells that are coupled in series.

The delay line may select a specific number of delay cells among the delay cells and delay an input signal by using the selected delay cells. The delay line may increase the delay amount of the input signal by increasing the number of the selected delay cells. Herein, as the number of the selected delay cells increases, the waveform of the input signal may become more sensitive to variations of a source voltage (i.e., a ground voltage and/or a power source voltage) supplied to the delay cells. In other words, increasing the number of the selected delay cells increases jitter in the delay line, which jitter may distort the waveform of the input signal proportionally.

SUMMARY

Embodiments of the present invention are directed to a delay line including delay cells that are robust to power noise.

In accordance with an embodiment of the present invention, a delay cell includes: a plurality of delay elements coupled in series; and at least one three-phase inverter that is coupled in parallel to at least one of the delay elements, and that receives through a first control terminal a first bias voltage for compensating for a variation of a power source voltage, and receives through a second control terminal a second bias voltage for compensating for a variation of a ground voltage.

In accordance with an embodiment of the present invention, a delay line includes: a plurality of first delay elements coupled in series and suitable for receiving an input signal based on a plurality of delay control signals; a plurality of second delay elements coupled in series and suitable for outputting an output signal; a plurality of third delay elements suitable for coupling the first delay elements and the second delay elements to each other based on the delay control signals; and a plurality of first three-phase inverters that are coupled in parallel with the first delay elements, and that receive through first control terminals a plurality of first bias voltages for compensating for a variation of a power source voltage, and receive through second control terminals a plurality of second bias voltages for compensating for a variation of a ground voltage.

In accordance with an embodiment of the present invention, a delay locked loop circuit includes: a delay line suitable for selecting unit delays to be used based on a plurality of delay control signals, delaying an external clock, and outputting a delay clock, and controlling a driving force of at least one delay element among the unit delays based on a first bias voltage and a second bias voltage; a replica delayer suitable for receiving the delay clock and generating a feedback clock by reflecting a delay amount of an actual clock path; a phase detector suitable for generating a phase comparison signal by comparing a phase of the external clock and a phase of the feedback clock with each other; and a delay controller suitable for generating the delay control signals based on the phase comparison signal, and generating the first bias voltage that compensates for a variation of a power source voltage and generating the second bias voltage that compensates for a variation of a ground voltage based on the delay control signals.

In accordance with an embodiment of the present invention, a delay cell includes: a first voltage generator configured to generate a first bias voltage compensating for variation in a first source voltage; a second voltage generator configured to generate a second bias voltage compensating variation in a second source voltage; a delay element operable based on the first and second source voltages; and a three-phase inverter coupled in parallel to the delay element and operable based on the first and second bias voltages.

In accordance with an embodiment of the present invention, a delay line includes: a first voltage generator configured to generate a first bias voltage compensating for variation in a first source voltage; a second voltage generator configured to generate a second bias voltage compensating variation in a second source voltage; and plural delay cells coupled to one another, wherein at least one delay cell among the delay cells includes: a delay element operable based on the first and second source voltages; and a three-phase inverter coupled in parallel to the delay element and operable based on the first and second bias voltages.

In accordance with an embodiment of the present invention, a delay locked loop circuit includes: a control circuitry configured to generate a first bias voltage compensating for variation in a first source voltage, and a second bias voltage compensating variation in a second source voltage, based on an external clock and a delay clock; and a delay line including at least one delay cell and configured to delay the external clock to generate the delay clock, wherein the delay cell includes: a delay element operable based on the first and second source voltages; and a three-phase inverter coupled in parallel to the delay element and operable based on the first and second bias voltages.

BRIEF DESCRIPTION OF THE DRAWINGS

FIG. 10 is a logic table for explaining operation of a voltage compensation circuit, such as that shown in FIG. 9.

DETAILED DESCRIPTION

Figure 1:
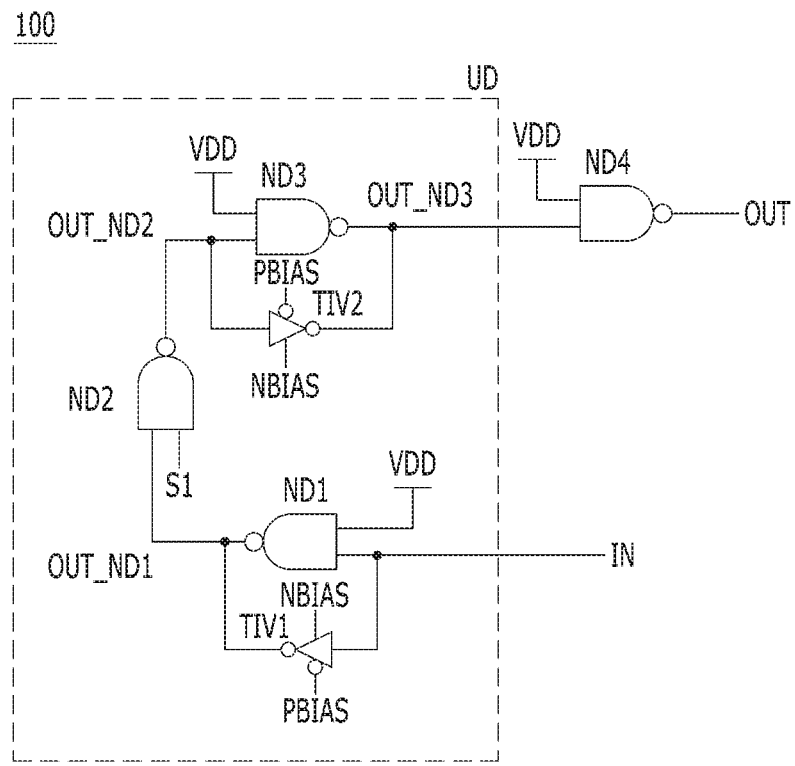
FIG. 1 is a circuit diagram illustrating a delay cell in accordance with an embodiment of the present invention.

Various embodiments of the present invention are described below in more detail with reference to the accompanying drawings. The present invention may, however, be embodied in different forms and thus should not be construed as limited to the embodiments set forth herein. Rather, these embodiments are provided so that this disclosure is thorough and complete and fully conveys the scope of the present invention to those skilled in the art. Throughout the disclosure, like reference numerals refer to like parts throughout the various figures and embodiments of the present invention. Also, throughout the specification, reference to "an embodiment," "another embodiment" or the like is not necessarily to only one embodiment, and different references to any such phrase are not necessarily to the same embodiment(s).

It will be understood that, although the terms "first", "second", "third", and so on may be used herein to describe various elements, these elements are not limited by these terms. These terms are used to distinguish one element from another element. Thus, a first element described below could also be termed as a second or third element without departing from the spirit and scope of the present invention.

It will be further understood that when an element is referred to as being "connected to", or "coupled to" another element, it may be directly on, connected to, or coupled to the other element, or one or more intervening elements may be present. In addition, it will also be understood that when an element is referred to as being "between" two elements, it may be the only element between the two elements, or one or more intervening elements may also be present. Communication between two elements, whether directly or indirectly connected/coupled, may be wired or wireless, unless stated or the context indicates otherwise.

As used herein, singular forms may include the plural forms as well and vice versa, unless the context clearly indicates otherwise. The articles 'a' and 'an' as used in this application and the appended claims should generally be construed to mean 'one or more' unless specified otherwise or clear from context to be directed to a singular form.

It will be further understood that the terms "comprises," "comprising," "includes," and "including" when used in this specification, specify the presence of the stated elements and do not preclude the presence or addition of one or more other elements. As used herein, the term "and/or" includes any and all combinations of one or more of the associated listed items.

Hereinafter, the various embodiments of the present invention will be described in detail with reference to the attached drawings.

FIG. 1 is a circuit diagram illustrating a delay cell 100 in accordance with an embodiment of the present invention.

Referring to FIG. 1, the delay cell 100 may be formed of a unit delay UD including first to third delay elements ND1 to ND3 coupled in series. Although FIG. 1 shows a case where three delay elements ND1 to ND3 are coupled in series, the present invention is not limited to that specific arrangement; the number of delay elements that are coupled in series within one unit delay UD may vary depending on design.

By way of example and not limitation, a first delay element ND1 may be realized as a NAND gate including a first input terminal for receiving a power source voltage VDD and a second input terminal for receiving an input signal IN. In other words, the first delay element ND1 may receive an input signal IN and invert the input signal IN and delay the inverted input signal for a set time. By way of example and not limitation, a second delay element ND2 may be realized as a NAND gate including a first input terminal for receiving a delay control signal S1 and a second input terminal for receiving an output OUT_ND1 of the first delay element ND1. The delay control signal S1 may be activated to a logic high level to operate the delay cell 100. In other words, when the delay control signal S1 is activated, the second delay element ND2 may receive the output OUT_ND1 of the first delay element ND1, and invert and delay it for a set time. By way of example and not limitation, the third delay element ND3 may be realized as a NAND gate including a first input terminal for receiving the power source voltage VDD and a second input terminal for receiving an output OUT_ND2 of the second delay element ND2. In other words, the third delay element ND3 may receive the output OUT_ND2 of the second delay element ND2, and invert and delay it for a set time.

The first to third delay elements ND1 to ND3 may be realized as inverting devices (for example, a NAND gate or an inverter). When the first to third delay elements ND1 to ND3 are formed of inverting devices, the delay cell 100 may further include an inverting device ND4 that receives an output OUT_ND3 of the third delay element ND3, and inverts and delays it in order to delay the input signal IN without phase inversion and provide it as an output signal OUT. By way of example and not limitation, the inverting device ND4 may be realized as a NAND gate including a first input terminal for receiving the power source voltage VDD and a second input terminal for receiving the output OUT_ND3 of the third delay element ND3.

The delay cell 100 in accordance with an embodiment of the present invention may further include at least one three-phase inverter TIV1 and TIV2 coupled in parallel to at least one delay element among the first to third delay elements ND1 to ND3. FIG. 1 shows a first three-phase inverter TIV1 and a second three-phase inverter TIV2 that are coupled in parallel to the first delay element ND1 and the third delay element ND3, respectively. For example, the first three-phase inverter TIV1 may be coupled between the second input terminal and the output terminal of the first delay element ND1, while the second three-phase inverter TIV2 may be coupled between the second input terminal and the output terminal of the second delay element ND3. Although FIG. 1 shows two three-phase inverters (the first three-phase inverter TIV1 and the second three-phase inverter TIV2), the present disclosure is not limited thereto. That is, the number of the three-phase inverters may vary depending on design.

The first and second three-phase inverters TIV1 and TIV2 may have a primary (or first) control terminal for receiving a first bias voltage NBIAS that compensates for variation of the power source voltage VDD and a secondary (or second) control terminal for receiving a second bias voltage PBIAS for compensating for variation of the ground voltage VSS. According to an embodiment of the present invention, the first bias voltage NBIAS may move in a direction opposite to the variation of the power source voltage VDD. In other words, when the voltage level of the power source voltage VDD increases above a target voltage, the voltage level of the first bias voltage NBIAS may decrease. When the voltage level of the power source voltage VDD is decreased lower than the target voltage, the voltage level of the first bias voltage NBIAS may increase. The second bias voltage PBIAS may move in the opposite direction to the variation of the ground voltage VSS. In other words, when the voltage level of the ground voltage VSS increases above the target voltage, the voltage level of the second bias voltage PBIAS may decrease. When the voltage level of the ground voltage VSS is decreased lower than the target voltage, the voltage level of the second bias voltage PBIAS may increase.

As described above, when the unit delay UD operates, the first three-phase inverter TIV1 and the second three-phase inverter TIV2 may operate in a path through which the input signal IN passes, and thus the generation of jitter may be suppressed by compensating a driving force that varies as the voltage levels of the power source voltage VDD and the ground voltage VSS are changed.

Figure 2:
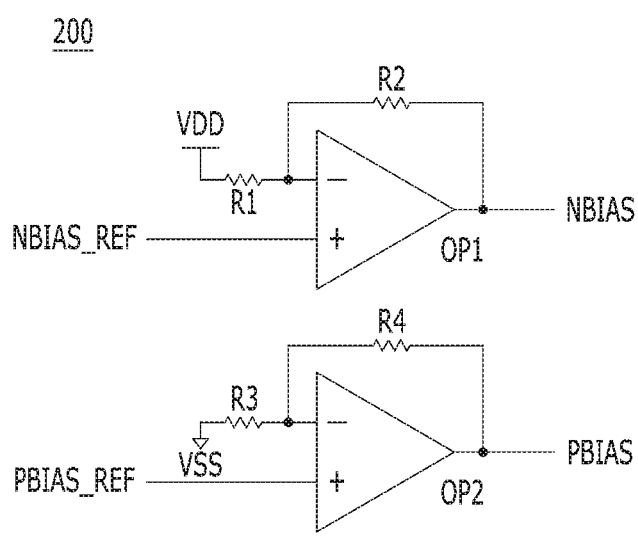
FIG. 2 is a circuit diagram illustrating a voltage generation circuit for generating first and second bias voltages, such as those shown in FIG. 1.

The delay cell 100 may further include a voltage generation circuit 200, such as that shown in FIG. 2, for generating the first bias voltage NBIAS and the second bias voltage PBIAS. The voltage generation circuit 200 may be provided within or externally to the delay cell 100.

FIG. 2 is a circuit diagram illustrating the voltage generation circuit 200 for generating the first bias voltage NBIAS and the second bias voltage PBIAS shown in FIG. 1.

Referring to FIG. 2, the voltage generation circuit 200 may include a first operational amplifier OP1, a second operational amplifier OP2, and first to fourth resistors R1 to R4.

The first operational amplifier OP1 may receive a first reference voltage NBIAS_REF at a positive (+) terminal and output the first bias voltage NBIAS at an output terminal. The first resistor R1 may be coupled between a power source voltage VDD terminal and a negative (−) terminal of the first operational amplifier OP1. The second resistor R2 may be coupled between a negative (−) terminal and the output terminal of the first operational amplifier OP1. With the above structure, the first operational amplifier OP1 may have an amplification gain (−R2/R1) based on the resistance ratio of the first resistor R1 and the second resistor R2.

The second operational amplifier OP2 may receive a second reference voltage PBIAS_REF at a positive (+) terminal and output the second bias voltage PBIAS at the output terminal. The third resistor R3 may be coupled between the ground voltage VSS and the negative (−) terminal of the second operational amplifier OP2. The fourth resistor R4 may be coupled between the negative (−) terminal and the output terminal of the second operational amplifier OP2. With the above structure, the second operational amplifier OP2 may have an amplification gain (−R4/R3) based on the resistance ratio of the third resistor R3 and the fourth resistor R4. According to an embodiment of the present invention, the ratio of the resistance of the first resistor R1 to the resistance of the second resistor R2 may be substantially the same as the ratio of the resistance of the third resistor R3 to the resistance of the fourth resistor R4.

For reference, the first reference voltage NBIAS_REF and the second reference voltage PBIAS_REF may be voltages having a uniform voltage level regardless of the variation of the voltage.

According to the embodiment of FIG. 2, the voltage generation circuit 200 may generate the first bias voltage NBIAS by amplifying the variation of the power source voltage VDD with respect to the first reference voltage NBIAS_REF at the ratio −R2/R1 and, generate the second bias voltage PBIAS by amplifying the variation of the ground voltage VSS with respect to the second reference voltage PBIAS_REF at the ratio −R4/R3. Therefore, the first bias voltage NBIAS may move in a direction opposite to the variation of the power source voltage VDD, and the second bias voltage PBIAS may move in the opposite direction to the variation of the ground voltage VSS.

Thus, according to an embodiment, since the power source voltage VDD or the ground voltage VSS having variation is applied, respectively, to the first and second operational-amplifiers OP1 and OP2, as an input voltage while the first reference voltage NBIAS_REF and the second reference voltage PBIAS_REF is applied as a reference voltage, the first and second operational-amplifiers OP1 and OP2 may be, for example, inverting operational-amplifiers whose gain is −R2/R1 for the first operational-amplifier OP1 and −R4/R3 for the second operational-amplifier.

Figure 3:
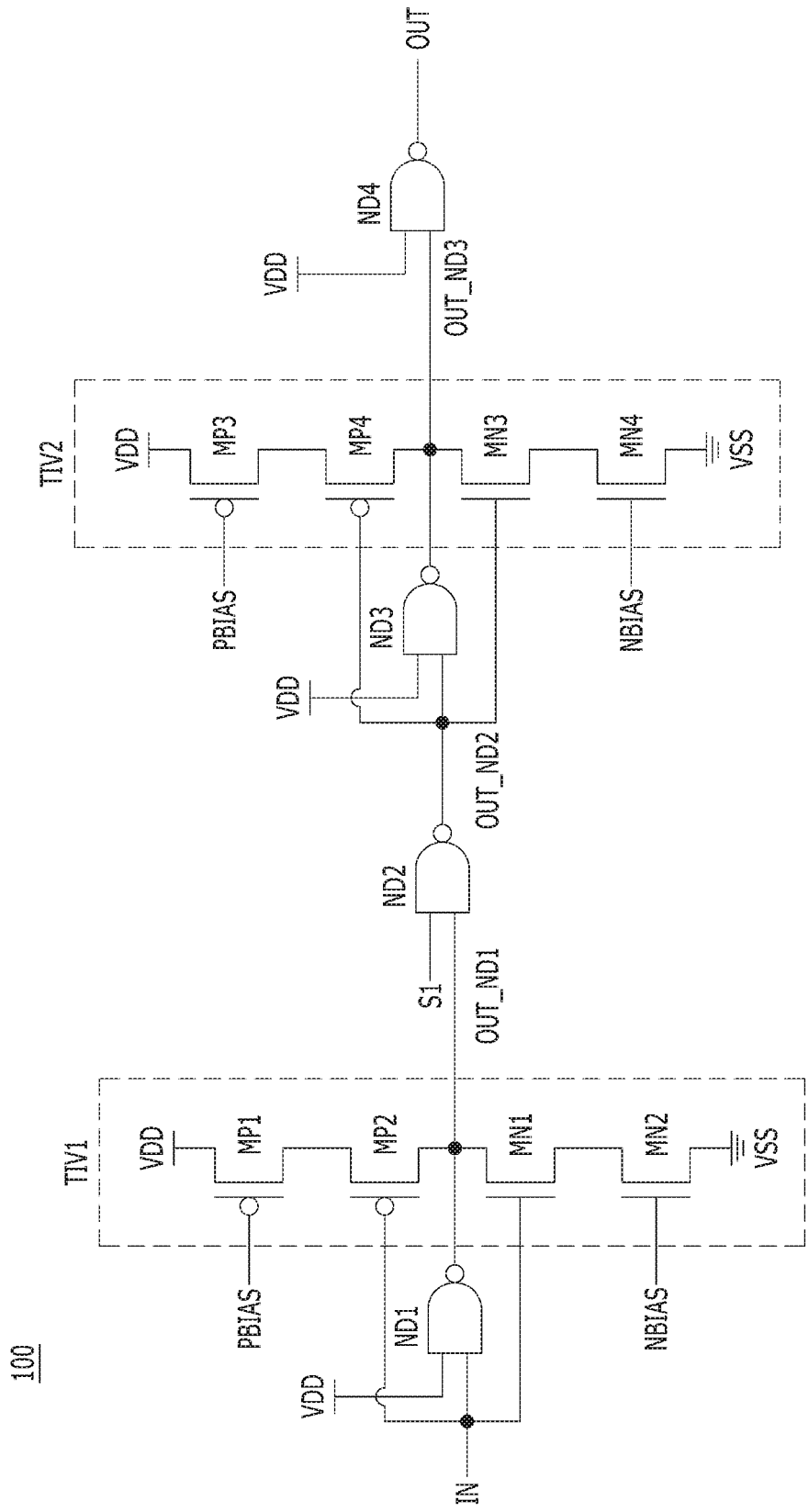
FIG. 3 is an equivalent circuit diagram illustrating a delay cell, such as that shown in FIG. 1.

FIG. 3 is an equivalent circuit diagram illustrating the delay cell 100 shown in FIG. 1 in accordance with an embodiment of the present invention.

According to an embodiment, the delay cell 100 may include first to third delay elements ND1 to ND3, an inverting device ND4, and first and second three-phase inverters TIV1 and TIV2.

Referring to FIG. 3, the first three-phase inverter TIV1 may include first to fourth transistors MP1, MP2, MN1, and MN2 that are coupled in series between the power source voltage VDD terminal and the ground voltage VSS terminal. According to an embodiment of the present invention, the first and second transistors MP1 and MP2 may be realized as PMOS (P-type Metal Oxide Semiconductor) transistors, and the third and fourth transistors MN1 and MN2 may be realized as NMOS (N-type Metal Oxide Semiconductor) transistors. The first transistor MP1 may receive the second bias voltage PBIAS through a gate, and a gate of the fourth transistor MN2 may receive the first bias voltage NBIAS. The gates of the second and third transistors MP2 and MN1 may be coupled to a second input terminal of the first delay element ND1 to receive the input signal IN. The drains of the second and third transistors MP2 and MN1 that are coupled in common may be coupled to the output OUT_ND1 of the first delay element ND1.

The second three-phase inverter TIV2 may include fifth to eighth transistors MP3, MP4, MN3 and MN4 that are coupled in series between the power source voltage VDD terminal and the ground voltage VSS terminal. According to an embodiment of the present invention, the fifth and sixth transistors MP3 and MP4 may be realized as PMOS transistors, and the seventh and eighth transistors MN3 and MN4 may be realized as NMOS transistors. The fifth transistor MP3 may receive the second bias voltage PBIAS through a gate, and a gate of the eighth transistor MN4 may receive the first bias voltage NBIAS. The gates of the sixth and seventh transistors MP4 and MN3 may be coupled to the second input terminal of the third delay element ND3 to receive the output OUT_ND2 of the second delay element ND2. The drains of the sixth and seventh transistors MP4 and MN3 that are coupled in common may be coupled to the output OUT_ND3 of the third delay element ND3.

A compensation operation of a three-phase inverter in accordance with an embodiment of the present invention is described below with reference to FIGS. 3 to 7.

Figure 4:
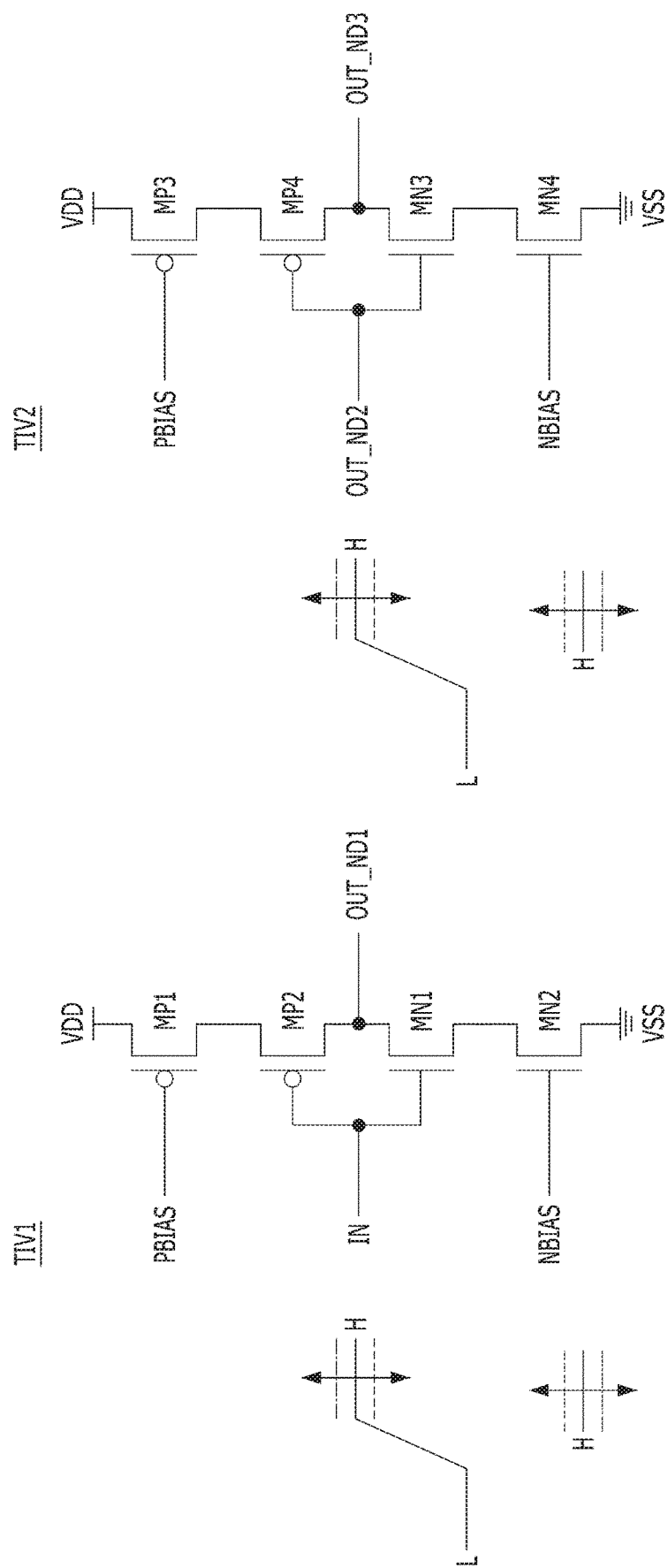
FIGS. 4 to 7 illustrates a compensation operation of a three-phase inverter in accordance with an embodiment of the present invention.
Figure 5:
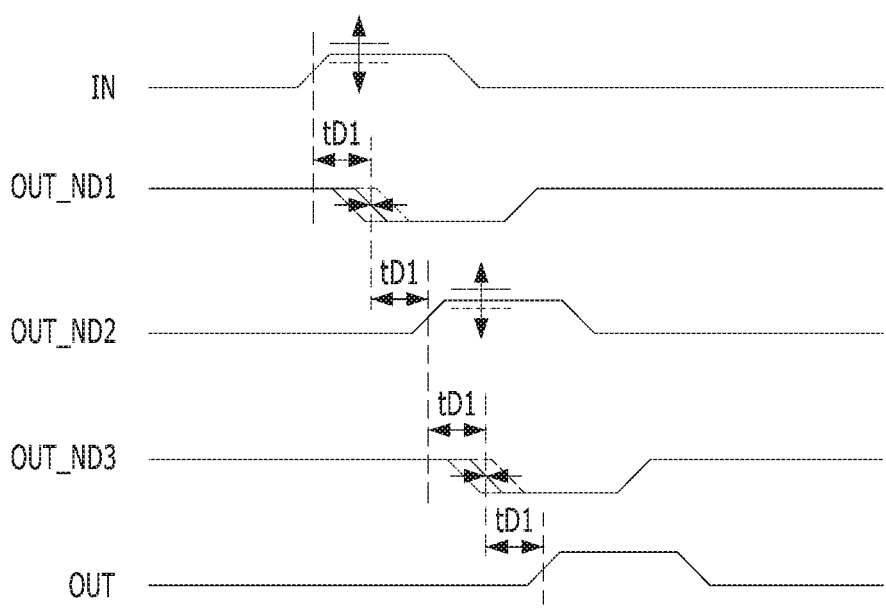
Figure 6:
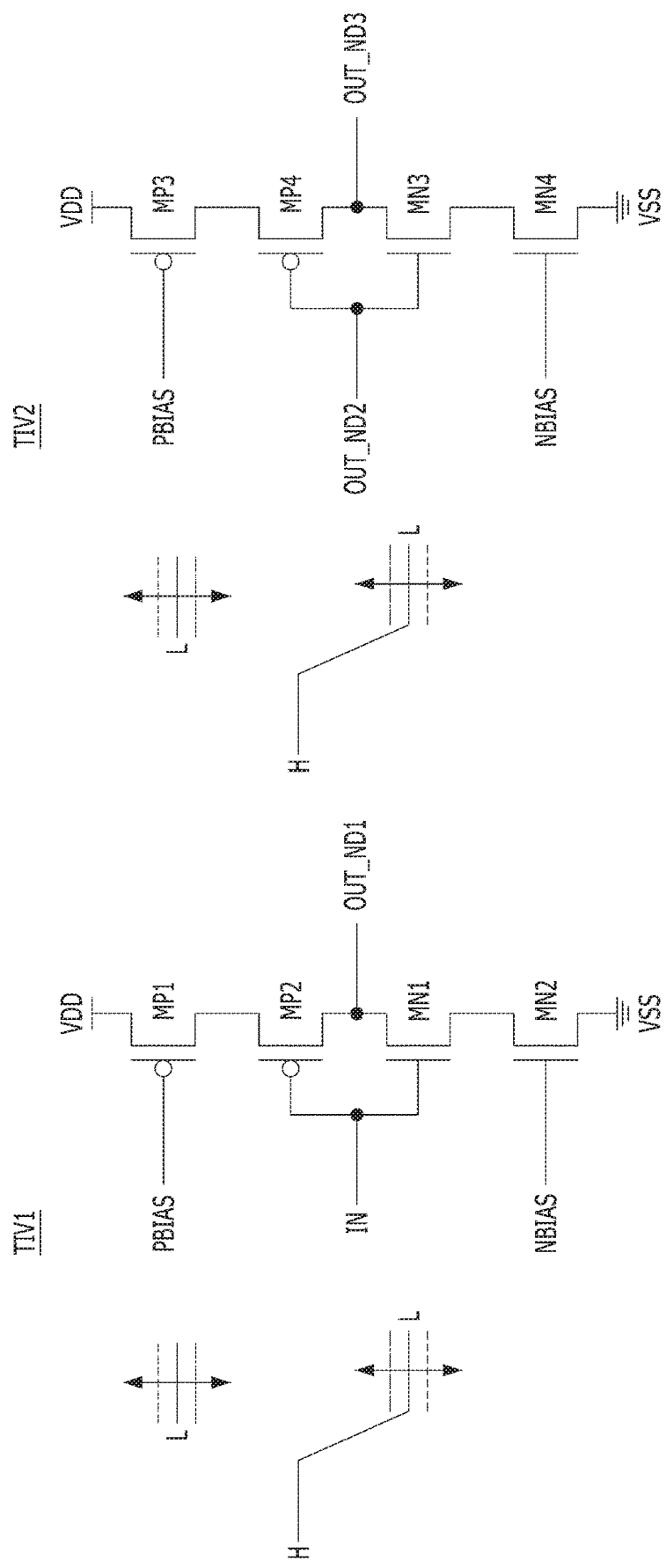
Figure 7:
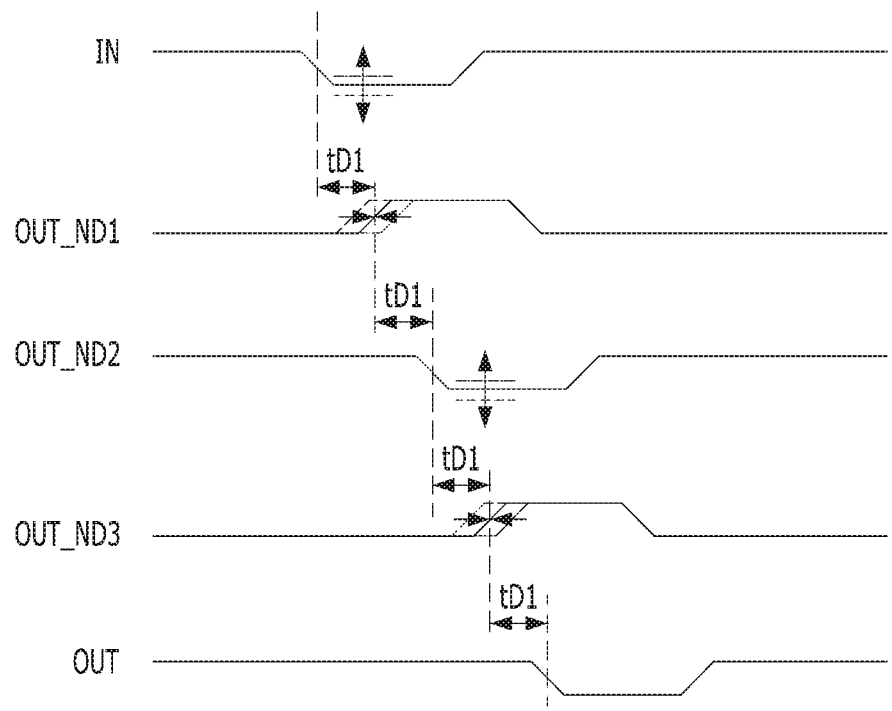

FIGS. 4 and 5 illustrate a circuit diagram and a timing diagram for explaining compensation operations of the first three-phase inverter TIV1 and the second three-phase inverter TIV2 based on the variation of the power source voltage VDD, respectively. FIGS. 6 and 7 illustrate a circuit diagram and a timing diagram for explaining the compensation operations of the first three-phase inverter TIV1 and the second three-phase inverter TIV2 based on the variation of the ground voltage VSS. In the context of the description below, it is assumed that the first to third delay elements ND1 to ND3 and the inverting device ND4 have the same delay amount tD1. However, the present invention is not limited to this specific arrangement. In another embodiment, different delay elements may have different delay amounts.

Referring to FIG. 3, the first delay element ND1 may invert and delay the input signal IN for a time tD1, which may be predetermined, and output the inverted and delayed signal as output OUT_ND1. When the delay control signal S1 is activated, the second delay element ND2 may invert and delay the output OUT_ND1 of the first delay element ND1 for the time tD1 and then output it as output OUT_ND2. The third delay element ND3 may invert and delay the output OUT_ND2 of the second delay element ND2 for the time tD1 and then output it as output OUT_ND3. Finally, the inverting device ND4 may output an output signal OUT by inverting the output OUT_ND3 of the third delay element ND3.

Referring to FIGS. 4 and 5, when the power source voltage VDD is increased, the logic high level of the input signal IN may be increased by a specific level, and the driving force of the third transistor MN1 may become stronger than that of the second transistor MP2. As a result, the output OUT_ND1 may transition to a logic low level more quickly. At this time, the voltage generation circuit 200 may decrease and output the first bias voltage NBIAS, as the power source voltage VDD is increased. Accordingly, the driving force of the fourth transistor MN2 may become weaker than that of the first transistor MP1, thus reducing the amount of current flowing through the first three-phase inverter TIV1. As a result, the delay amount tD1 of the output OUT_ND1 with respect to the input signal IN may be maintained and corrected to a uniform level, that is, kept robust to power noise. Similarly, when the power source voltage VDD is increased, the driving force of the seventh transistor MN3 may become stronger than that of the sixth transistor MP4, and thus the output OUT_ND3 may transition to a logic low level more quickly. However, according to the reduced first bias voltage NBIAS, the driving force of the eighth transistor MN4 may become weaker than that of the fifth transistor MP3, and thus the amount of current flowing through the second three-phase inverter TIV2 may be reduced. As a result, the delay amount tD1 of the output OUT_ND3 with respect to the input signal (i.e., the output OUT_ND2) may be maintained and corrected to a uniform level, that is, kept robust to power noise.

On the other hand, when the power source voltage VDD is decreased, the logic high level of the input signal IN may decrease by a specific level and the driving force of the third transistor MN1 may become weak. As a result, the output OUT_ND1 may transition to a logic low level more slowly. At this time, the voltage generation circuit 200 may increase and output the first bias voltage NBIAS, as the power source voltage VDD is decreased. Accordingly, the driving force of the fourth transistor MN2 may become stronger than that of the first transistor MP1, and thus the amount of current flowing through the first three-phase inverter TIV1 may be increased. As a result, the delay amount tD1 of the output OUT_ND1 with respect to the input signal IN may be maintained and corrected to a uniform level, that is, kept robust to power noise. Similarly, when the power source voltage VDD is decreased, the driving force of the seventh transistor MN3 may become weaker than that of the sixth transistor MP4, and the output OUT_ND3 may transition to a logic low level more slowly. However, according to the increased first bias voltage NBIAS, the driving force of the eighth transistor MN4 may become stronger than that of the fifth transistor MP3, and thus the amount of current flowing through the second three-phase inverter TIV2 may be increased. As a result, the delay amount tD1 of the output OUT_ND3 with respect to the input signal (i.e., the output OUT_ND2) may be maintained and corrected to a uniform level, that is, kept robust to power noise.

Referring to FIGS. 6 and 7, when the ground voltage VSS is increased, the logic low level of the input signal IN may be increased by a specific level and the driving force of the second transistor MP2 may become weaker than that of the third transistor MN1, and thus the output OUT_ND1 may transition to a logic high level more slowly. At this time, the voltage generation circuit 200 may decrease and output the second bias voltage PBIAS as the ground voltage VSS is increased. Accordingly, the driving force of the first transistor MP1 may become strong, and thus the amount of current flowing through the first three-phase inverter TIV1 may be increased. As a result, the delay amount tD1 of the output OUT_ND1 with respect to the input signal IN may be maintained and corrected to a uniform level, that is, kept robust to power noise. Similarly, when the ground voltage VSS is increased, the driving force of the sixth transistor MP4 may become weak, and the output OUT_ND3 may transition to a logic high level more slowly. However, according to the increased second bias voltage PBIAS, the driving force of the fifth transistor MP3 may become strong, and the amount of current flowing through the second three-phase inverter TIV2 may be increased. As a result, the delay amount tD1 of the output OUT_ND3 with respect to the input signal (i.e., the output OUT_ND2) may be maintained and corrected to a uniform level, that is, kept robust to power noise.

Conversely, when the ground voltage VSS is decreased, the logic low level of the input signal IN may be decreased by a set level and the driving force of the second transistor MP2 may become stronger than that of the third transistor MN1, and thus the output OUT_ND1 may transition to a logic high level more quickly. At this time, the voltage generation circuit 200 may increase and output the second bias voltage PBIAS as the ground voltage VSS is decreased. Accordingly, the driving force of the first transistor MP1 may become weaker than that of the fourth transistor MN2, and the amount of current flowing through the first three-phase inverter TIV1 may be decreased. As a result, the delay amount tD1 of the output OUT_ND1 with respect to the input signal IN may be maintained and corrected to a uniform level, that is, kept robust to power noise. Similarly, when the ground voltage VSS is decreased, the driving force of the sixth transistor MP4 may become strong, and the output OUT_ND3 may transition to a logic high level more quickly. However, according to the increased second bias voltage PBIAS, the driving force of the fifth transistor MP3 may become weaker than that of the eighth transistor MN4, and the amount of current flowing through the second three-phase inverter TIV2 may be decreased. As a result, the delay amount tD1 of the output OUT_ND3 with respect to the input signal (i.e., the output OUT_ND2) may be maintained and corrected to uniform level.

As described above, according to an embodiment of the proposed invention, the generation of jitter may be suppressed by compensating the driving force that varies as the voltage levels of the power source voltage VDD and the ground voltage VSS are changed. Herein, when the variation of the power source voltage VDD or the variation of the ground voltage VSS is to be detected more sensitively to compensate the driving force, the first operational amplifier OP1 and the second operational amplifier OP2 of the voltage generation circuit 200 may be set to have a higher amplification gain. Herein, the first bias voltage NBIAS and the second bias voltage PBIAS may be set to be included in the operating region of an NMOS/PMOS transistor.

Figure 8:
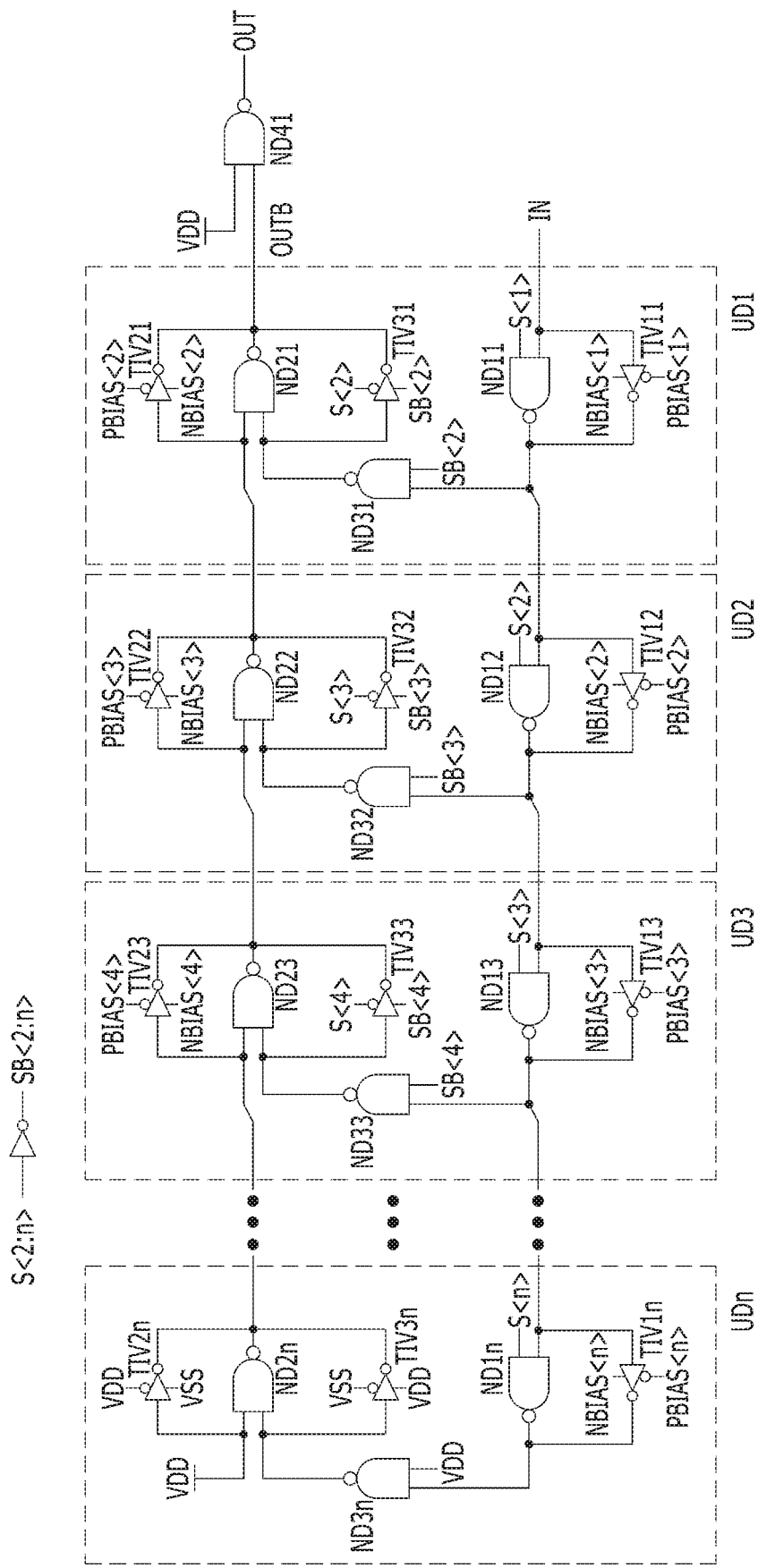
FIG. 8 is a circuit diagram illustrating a delay line in accordance with an embodiment of the present invention.

FIG. 8 is a circuit diagram illustrating a delay line 300 in accordance with an embodiment of the present invention.

Referring to FIG. 8, the delay line 300 may include a plurality of first delay elements ND11 to ND1$n$, a plurality of second delay elements ND21 to ND2$n$, and a plurality of third delay elements ND31 to ND3$n$. The first to third delay elements ND11 to ND1$n$, ND21 to ND2$n$ and ND31 to ND3$n$ may correspond to each other, and the corresponding first to third delay elements may form one unit delay UD. In short, the delay line 300 may include a plurality of unit delays UD1 to UDn.

The first delay elements ND11 to ND1$n$ may be coupled in series to receive the input signal IN based on a plurality of delay control signals S<1:$n$>. By way of example and not limitation, each of the first delay elements ND11 to ND1$n$ may be realized as a NAND gate that receives a corresponding signal among the delay control signals S<1:$n$> through a first input terminal and receive an output of a preceding stage through a second input terminal. The first delay element ND11 of the first stage may receive the input signal IN through the second input terminal. In other words, the first delay elements ND11 to ND1$n$ may invert the input signal IN and delay the inverted input signal for a set time based on the delay control signals S<1:$n$>.

The second delay elements ND21 to ND2$n$ may be coupled in series to output an output signal OUTB. By way of example and not limitation, each of the second delay elements ND21 to ND2$n$ may be realized as a NAND gate that receives the output of the preceding stage through the first input stage and receives the output of the corresponding third delay element through the second input terminal. The second delay element ND2$n$ of the last stage may receive the power source voltage VDD through the first input terminal and the second delay element ND21 at the first stage may receive the output signal OUTB.

The third delay elements ND31 to ND3$n$ may couple the first delay elements ND11 to ND1$n$ to the second delay elements ND21 to ND2$n$ respectively, based on inverted delay control signals SB<2:$n$> that are generated by inverting a plurality of delay control signals S<2:$n$>. By way of example and not limitation, each of the third delay elements ND31 to ND3$n$ may be realized as a NAND gate that receives a corresponding signal among the inverted delay control signals SB<2:$n$> through the first input terminal, and receives the output of the first delay element. The third delay element ND31 of the first stage may receive the inverted delay control signal SB<2> through the first input terminal. The third delay element ND32 of the second stage may receive the inverted delay control signal SB<3> through the first input terminal. In this manner, the third delay element ND3$n$ of the last stage may receive the power source voltage VDD through the first input terminal. In short, the third delay elements ND31 to ND3$n$ may delay the output of the first delay elements ND11 to ND1$n$ for a set time based on the inverted delay control signals SB<2:$n$> and provide the delayed signal to the second input terminals of the second delay elements ND21 to ND2$n$.

According to an embodiment, first to third delay elements ND11 to ND1$n$, ND21 to ND2$n$ and ND31 to ND3$n$ may be realized as an inverting device (for example, a NAND gate or an inverter). When the first to third delay elements ND11 to ND1$n$, ND21 to ND2$n$ and ND31 to ND3$n$ are formed as an inverting device, in order to delay the input signal IN without phase inversion and provide the delayed input signal as the final output signal OUT, the delay line 300 may further include an inverting device ND41 for receiving the output signal OUTB of the second delay elements ND21 to ND2$n$, and inverting and outputting it as output OUT. By way of example and not limitation, the inverting device ND41 may be realized as a NAND gate that receives the power source voltage VDD through the first input terminal and receives the output OUTB of the third delay element ND31 to ND3$n$ through the second input terminal.

Also, the delay line 300 in accordance with an embodiment of the present invention may include a plurality of first three-phase inverters TIV11 to TIV1$n$ that are coupled in parallel with the first delay elements ND11 to ND1$n$. The first three-phase inverters TIV11 to TIV1$n$ may receive a plurality of first bias voltages NBIAS<1:$n$> for compensating for the variation of the power source voltage VDD through a first control terminal, and receive a plurality of second bias voltages PBIAS<1:$n$> for compensating for the variation of the ground voltage VSS through a second control terminal. For example, the first three-phase inverters TIV11 to TIV1$n$ may be coupled between the second input terminal and the output terminal of the first delay elements ND11 to ND1$n$. The first three-phase inverters TIV11 to TIV1$n$ may have substantially the same structure as the first three-phase inverter TIV1 described above with reference to FIGS. 3 to 7.

Also, the delay line 300 in accordance with an embodiment of the present invention may include a plurality of second three-phase inverters TIV21 to TIV2$n$ and a plurality of third three-phase inverters TIV31 to TIV3$n$ that are coupled in parallel with the second delay elements ND21 to ND2$n$. The second three-phase inverters TIV21 to TIV2$n$ may be coupled in parallel between the first input terminal and the output terminal of the second delay elements ND21 to ND2$n$ to receive a plurality of first bias voltages NBIAS<2:$n$> for compensating for the variation of the power source voltage VDD through the first control terminal and to receive a plurality of second bias voltages PBIAS<2:$n$> for compensating for the variation of the ground voltage VSS through the second control terminal. The third three-phase inverters TIV31 to TIV3$n$ may be coupled in parallel between the second input terminal and an output terminal of the second delay elements ND21 to ND2$n$ to receive inverted delay control signals SB<2:$n$> through the first control terminal, and receive a plurality of delay control signals S<2:$n$> through the second control terminal. In other words, the third three-phase inverters TIV31 to TIV3$n$ may be turned on/off based on the delay control signals S<2:$n$> and the inverted delay control signals SB<2:$n$>. Each of the second three-phase inverters TIV21 to TIV2$n$ and the third three-phase inverters TIV31 to TIV3$n$ may have substantially the same structure as the second three-phase inverters TIV2 described above with reference to FIGS. 3 to 7.

The second three-phase inverter TIV2$n$ of the last stage among the second three-phase inverters TIV21 to TIV2$n$ may receive the ground voltage VSS and the power source voltage VDD through the first and second control terminals, respectively. On the other hand, the third three-phase inverter TIV3n of the last stage among the third three-phase inverters TIV31 to TIV3n may receive the power source voltage VDD and the ground voltage VSS through the first and second control terminals, respectively. Therefore, whereas the second three-phase inverter TIV2n of the last stage maintains a turn-off state, the third-stage three-phase inverter TIV3n of the last stage may maintain a turn-on state.

Figure 9:
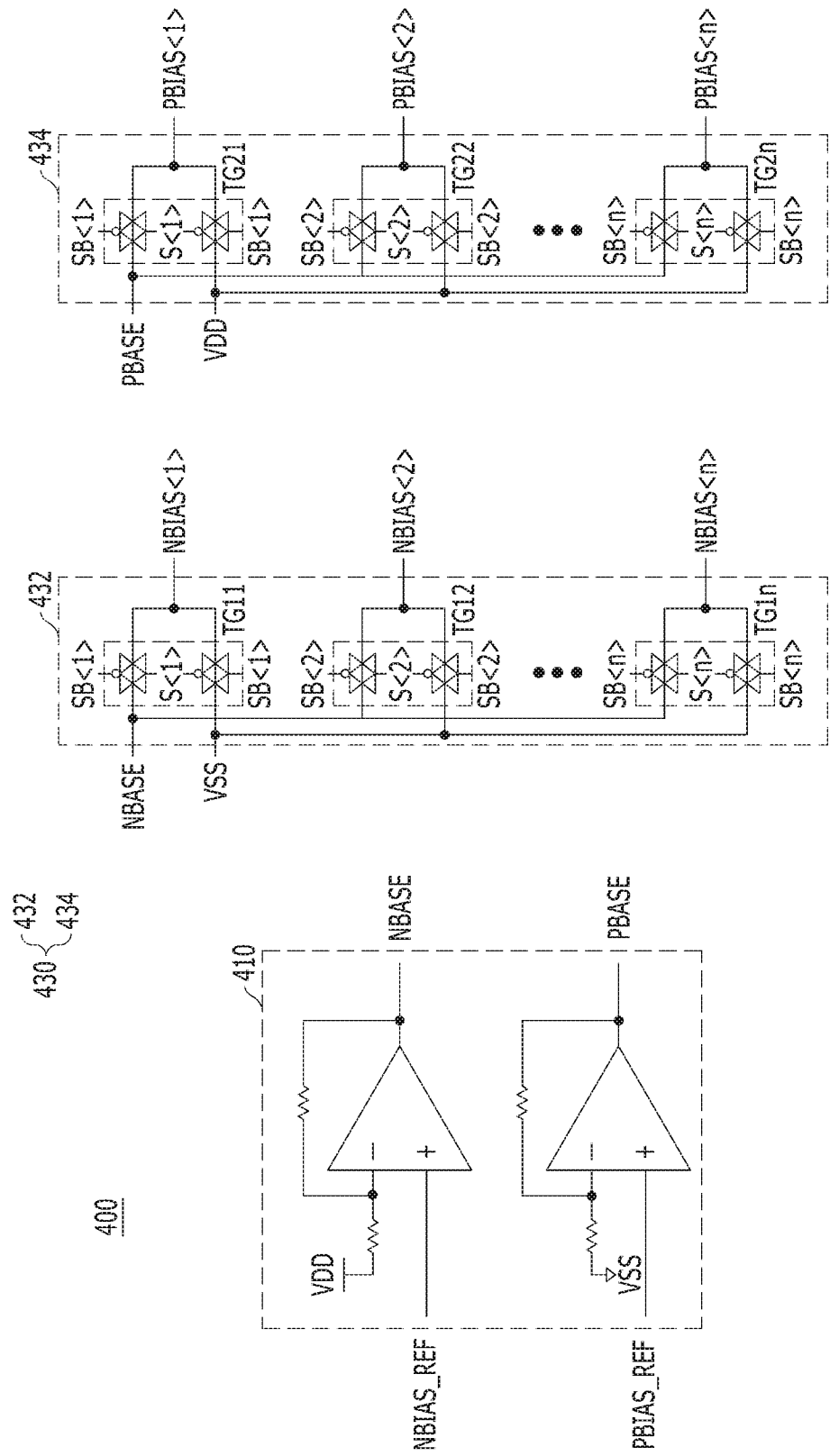
FIG. 9 is a circuit diagram illustrating a voltage compensation circuit for generating a plurality of first and second bias voltages, such as those shown in FIG. 8.

The delay line 300 may include a voltage compensation circuit 400, such as that shown in FIG. 9, for generating a plurality of first bias voltages NBIAS<1:n> and a plurality of second bias voltages PBIAS<1:n>. The voltage compensation circuit 400 may be provided within or externally to the delay line 300.

FIG. 9 is a circuit diagram illustrating the voltage compensation circuit 400 for generating a plurality of first bias voltages NBIAS<1:n> and a plurality of second bias voltages PBIAS<1:n> shown in FIG. 8. FIG. 10 is a logic table explaining an operation of the voltage compensation circuit 400 shown in FIG. 9.

Referring to FIG. 9, the voltage compensation circuit 400 may include a voltage generation circuit 410 and a voltage output circuit 430.

The voltage generation circuit 410 may generate a first base voltage NBASE by amplifying the variation of the power source voltage VDD with respect to the first reference voltage NBIAS_REF at a ratio −R2/R1, and generate a second base voltage PBASE by amplifying the variation of the ground voltage VSS with respect to the two reference voltages PBIAS_REF at a ratio −R4/R3. The voltage generation circuit 410 may have substantially the same structure as the voltage generation circuit 200 of FIG. 2.

The voltage output circuit 430 may output the first base voltage NBASE as at least one among the first bias voltages NBIAS<1:n> and output the second base voltage PBASE as at least one among the second bias voltages PBIAS<1:n>, based on the delay control signals S<1:n> and the inverted delay control signals SB<1:n>.

According to an embodiment, the voltage output circuit 430 may include a first voltage output unit 432 and a second voltage output unit 434.

The first voltage output unit 432 may select first base voltage NBASE or the ground voltage VSS and output the first bias voltages NBIAS<1:n> based on the delay control signals S<1:n> and the inverted delay control signals SB<1:n>. According to an embodiment, the first voltage output unit 432 may include a plurality of first transferors TG11 to TG1n that respectively output a plurality of first bias voltages NBIAS<1:n>. When the delay control signals S<1:n> are activated, the first transferors TG11 to TG1n may output the first base voltage NBASE as the first bias voltages NBIAS<1:n>. When the inverted delay control signals SB<1:n> are activated, the first transferors TG11 to TG1n may output the ground voltage VSS as the first bias voltages NBIAS<1:n>.

The second voltage output unit 434 may select the second base voltage PBASE or the power source voltage VDD based on the delay control signals S<1:n> and the inverted delay control signals SB<1:n>, and output the second bias voltages PBIAS<1:n>. According to an embodiment, the second voltage output unit 434 may include a plurality of second transferors TG21 to TG2n that respectively output a plurality of second bias voltages PBIAS<1:n>. When the delay control signals S<1:n> are activated, the second transferors TG21 to TG2n may output the second base voltage PBASE as the second bias voltages PBIAS<1:n>.

When the inverted delay control signals SB<1:n> are activated, the second transferors TG21 to TG2n may output the power source voltage VDD as the second bias voltages PBIAS<1:n>.

The delay control signals S<1:n> may be the signals that are set to determine the number of unit delays to be used among the unit delays UD1 to UDn. In an embodiment of the present invention, the delay control signals S<1:n> may be formed of a thermometer code (which is a unary code). Referring to FIG. 10, when one unit delay (e.g., the first unit delay UD1) among the unit delays UD1 to UDn is to be used, the delay control signals S<1:n> may have an initial value of '1000 . . . 0000'. As the number of unit delays to be used increases, the delay control signals S<1:n> may be increased to '1100 . . . 0000', '1110 . . . 0000', '1111 . . . 1111'.

For example, when the delay control signals S<1:n> is '1000 . . . 0000', the voltage compensation circuit 400 may output the first and second base voltages NBASE and PBASE as the first and second bias voltages NBIAS<1> and PBIAS<1>, respectively, based on the delay control signal S<1> that is activated to a logic high level. Herein, the voltage compensation circuit 400 may fix the remaining first bias voltages NBIAS<2:n> to the ground voltage VSS and output them, and the voltage compensation circuit 400 may fix the remaining second bias voltages PBIAS<2:n> to the power source voltage VDD and output them. In this way, when the delay control signals S<1:n> have a value of '1111 . . . 1111', the voltage compensation circuit 400 may output the first and second base voltages NBASE and PBASE as the first and second bias voltages NBIAS<1:n> and PBIAS<1:n>, respectively, based on the delay control signals S<1:n> that are activated to a logic high level.

As described above, the voltage compensation circuit 400 may generate the first bias voltages NBIAS<1:n> by amplifying the variation of the power source voltage VDD with respect to the first reference voltage NBIAS_REF at a ratio −R2/R1, and generate the second bias voltages PBIAS<1:n> by amplifying the variation of the ground voltage VSS with respect to the second reference voltage PBIAS_REF at a ratio −R4/R3.

Operation of the delay line in accordance with an embodiment of the present invention is described below with reference to FIGS. 8 to 11C.

Figure 11A:
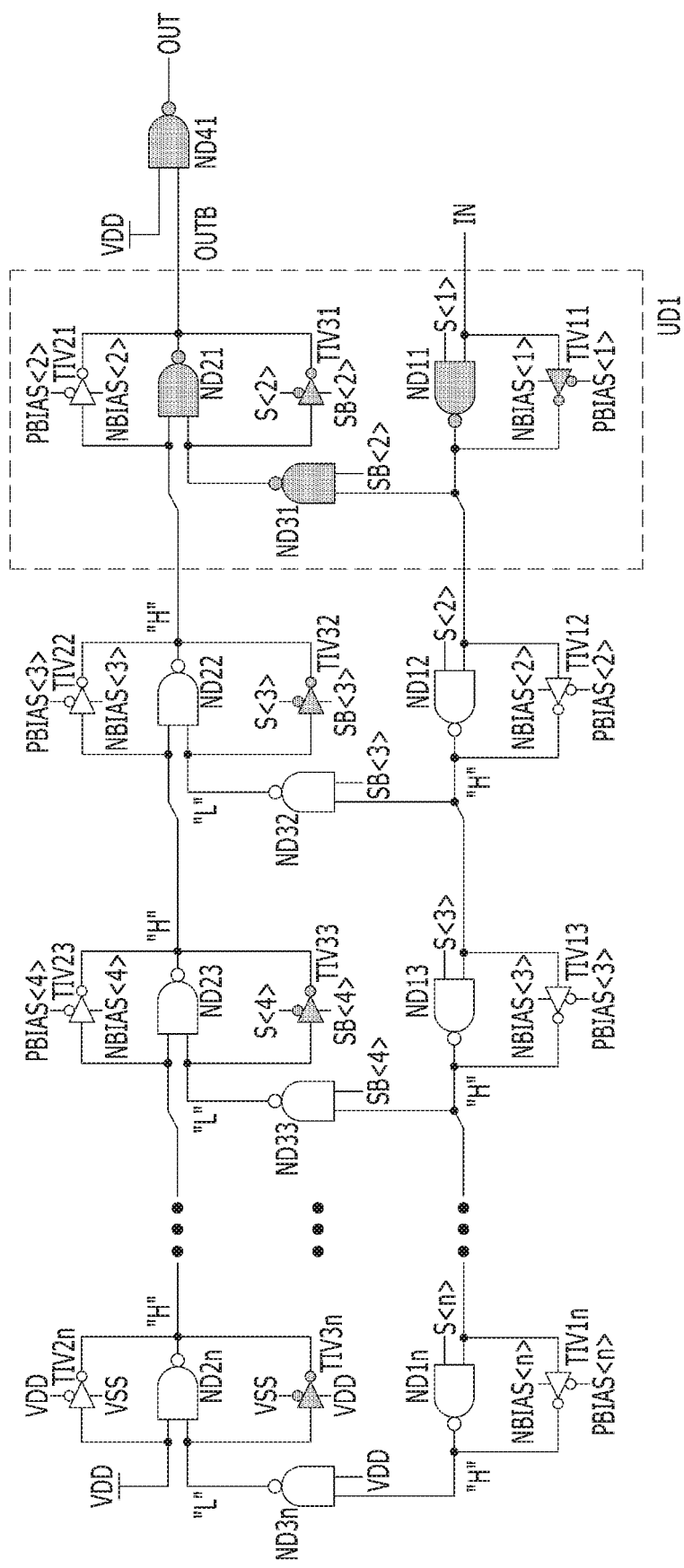
FIGS. 11A to 11C are circuit diagrams illustrating an operation of a delay line, such as that shown in FIG. 8.
Figure 11B:
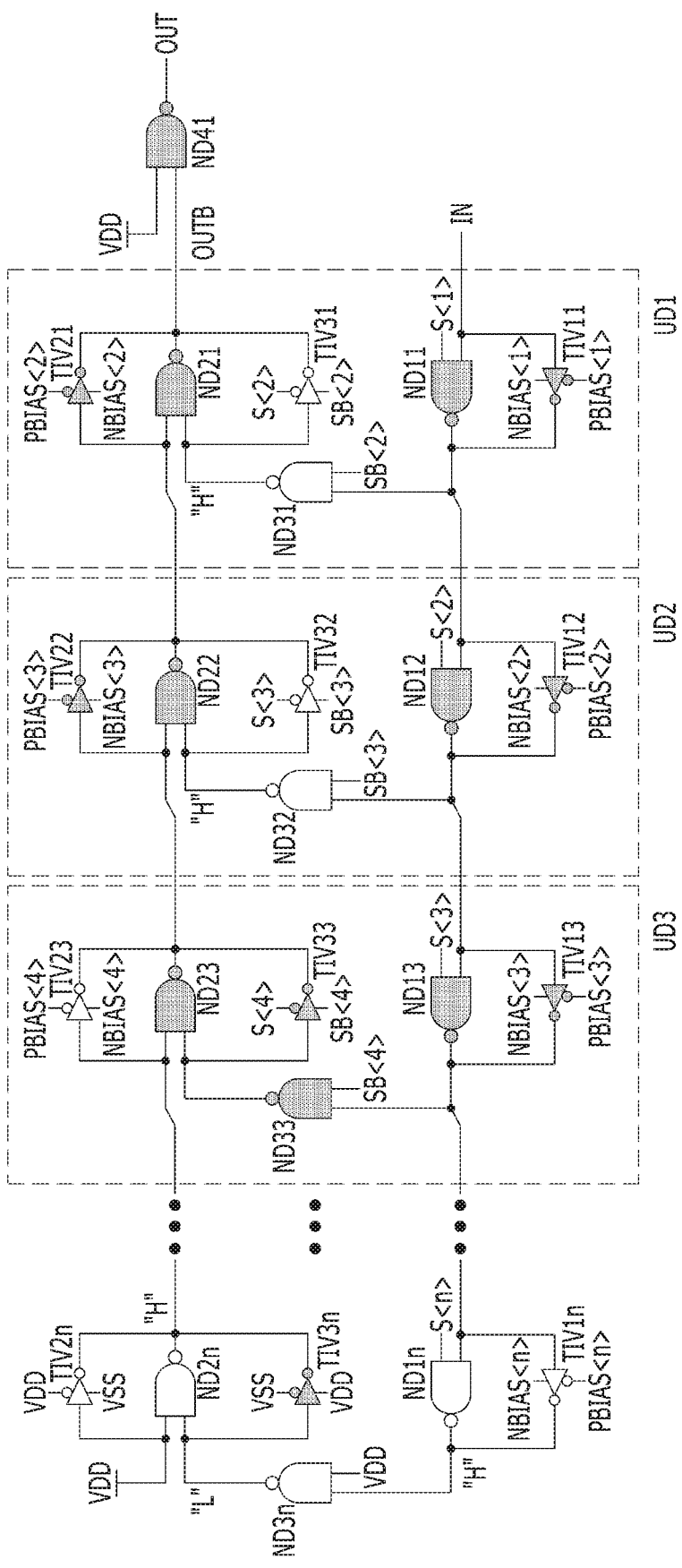
Figure 11C:
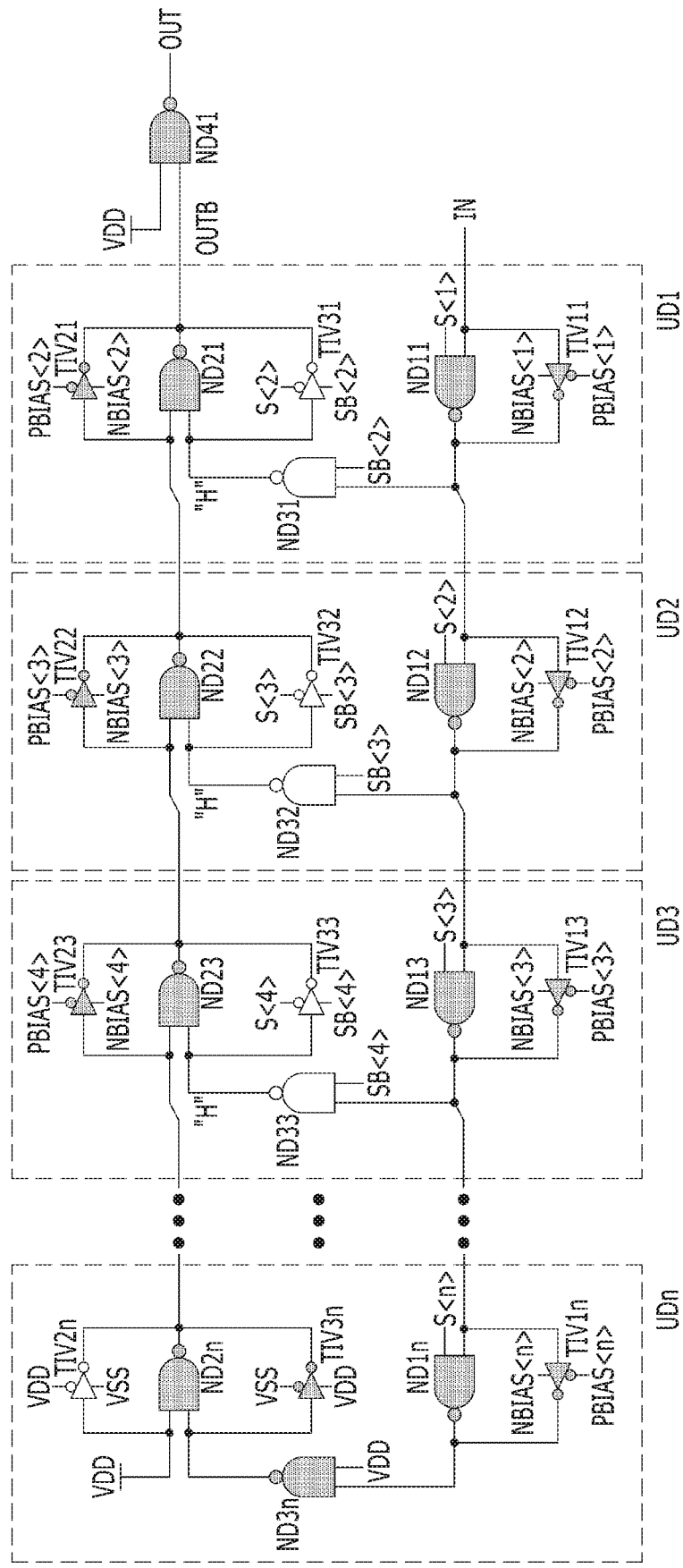

FIGS. 11A to 11C are circuit diagrams illustrating an operation of the delay line shown in FIG. 8.

Referring to FIG. 11A, a case where the delay control signals S<1:n> are '1000 . . . 0000' is shown. In other words, the delay control signal S<1> may be activated to a logic high level, and the remaining delay control signals S<2:n> may be deactivated to a logic low level. In addition, the inverted delay control signal SB<1> may be activated to a logic low level, and the remaining inverted delay control signals SB<2:n> may be deactivated to a logic high level.

In this case, only the shadowed first delay element ND11 of the first stage may operate as a delay element (i.e., an inverter), and the remaining first delay elements ND12 to ND1n may provide an output fixed to a logic high level. Also, only the shadowed third delay element ND31 of the first stage may operate as a delay element, and the remaining third delay elements ND32 to ND3n may provide an output fixed to a logic low level. Accordingly, the remaining second delay elements ND22 to ND2n, except for the shadowed second delay element ND21, of the first stage may provide an output fixed to a logic high level. The shadowed second delay element ND21 of the first stage may operate as a delay element. In short, the first unit delay UD1 may operate to delay the input signal IN and provide it as the output signal OUTB.

Herein, the voltage compensation circuit 400 may output the first and second base voltages NBASE and PBASE as the first and second bias voltages NBIAS<1> and PBIAS<1>, respectively, and output the remaining first bias voltages NBIAS<2:$n$> after fixing them to the ground voltage VSS and output the remaining second bias voltages PBIAS<2:$n$> after fixing them to the power source voltage VDD. Therefore, the shadowed first three-phase inverter TIV11 of the first stage and the shadowed third three-phase inverters TIV31 to TIV3$n$ may be activated and operated.

As a result, when the first unit delay UD1 operates, the first three-phase inverter TIV11 may operate in the path through which the input signal IN passes and thus the generation of jitter may be suppressed by compensating the driving force that varies as the voltage levels of the power source voltage VDD and the ground voltage VSS are changed.

According to an embodiment, the delay line 300 shown in FIG. 11A further includes an inverting device ND41 for receiving the output signal OUTB of the first unit delay UD1, and inverting it and outputting it as output OUT. By way of example and not limitation, the inverting device ND41 may be realized as a NAND gate that receives the power source voltage VDD through the first input terminal and receives the output OUTB through the second input terminal.

Referring to FIG. 11B, a case where the delay control signals S<1:$n$> is '1110 . . . 0000' is shown.

In this case, the shadowed first delay elements ND11 to ND13 may each operate as a delay element (i.e., an inverter), and the remaining first delay elements ND14 to ND1$n$ may provide an output fixed to a logic high level. Also, only the shadowed third delay element ND33, which corresponds to the last, i.e., ND13, among the first delay elements ND11 to ND13, may operate as a delay element, and the third delay elements ND31 and ND32, which correspond to ND11 and ND12, may provide an output fixed to a logic high level, and the remaining third delay elements ND34 to ND3$n$ may provide an output fixed to a logic low Level. Accordingly, the shadowed second delay elements ND21 to ND23, which correspond to the first delay elements ND11 to ND13, may operate as delay elements, and the remaining second delay elements ND24 to ND2$n$ may provide an output fixed to a logic high level. In other words, the first to third unit delays UD1 to UD3 may operate to delay the input signal IN and provide it as the output signal OUTB.

Herein, the voltage compensation circuit 400 may output the first and second base voltages NBASE and PBASE as the first and second bias voltages NBIAS<1:3> and PBIAS<1:3>, respectively. Therefore, the shadowed first three-phase inverters TIV11 to TIV13, the shadowed second three-phase inverters TIV21 and TIV22, and the shadowed third three-phase inverters TIV33 to TIV3$n$ may be activated and operate.

As a result, when the first to third unit delays UD1 to UD3 operate, the first three-phase inverters TIV11 to TIV13 and the second three-phase inverters TIV21 and TIV22 may operate in a path through which the input signal IN passes and thus the generation of jitter may be suppressed by compensating the driving force that varies as the voltage levels of the power source voltage VDD and the ground voltage VSS are changed.

According to an embodiment, the delay line 300 shown in FIG. 11B further includes an inverting device ND41 for receiving the output signal OUTB of the first to third unit delay UD1 to UD3, and inverting it and outputting it as output OUT. By way of example and not limitation, the inverting device ND41 may be realized as a NAND gate that receives the power source voltage VDD through the first input terminal and receives the output OUTB through the second input terminal.

Referring to FIG. 11C, a case where the delay control signals S<1:$n$> are '1111 . . . 1111' is shown.

In this case, all of the shadowed first delay elements ND11 to ND1$n$ may operate as delay elements (i.e., inverters). Also, only the shadowed third delay element ND3$n$ of the last stage may operate as a delay element, and the remaining third delay elements ND31 to ND3$n$-1 may provide an output fixed to a logic high level. Accordingly, all of the shadowed second delay elements ND21 to ND2$n$ may operate as delay elements. In short, the first to $n^{th}$ unit delays UD1 to UDn may operate to delay the input signal IN and provide it as the output signal OUTB.

Herein, the voltage compensation circuit 400 may output the first and second base voltages NBASE and PBASE as all the first and second bias voltages NBIAS<1:$n$> and PBIAS<1:$n$>. Therefore, all of the shadowed first three-phase inverters TIV11 to TIV1$n$, the shadowed second three-phase inverters TIV21 to TIV2$n$-1 except for those of the last stage, and the shadowed third-stage three-phase inverter TIV3$n$ of the last stage may be activated and operate.

As a result, when the first to $n^{th}$ unit delays UD1 to UDn operate, the first three-phase inverters TIV11 to TIV1$n$ and the second three-phase inverters TIV21 to TIV2$n$-1 may operate in a path through which the input signal IN passes and thus the generation of jitter may be suppressed by compensating the driving force that varies as the voltage levels of the power source voltage VDD and the ground voltage VSS are changed.

According to an embodiment, the delay line 300 shown in FIG. 11C further includes an inverting device ND41 for receiving the output signal OUTB of the first to nth unit delays UD1 to UDn, and inverting it and outputting it as output OUT. By way of example and not limitation, the inverting device ND41 may be realized as a NAND gate that receives the power source voltage VDD through the first input terminal and receives the output OUTB through the second input terminal.

Referring to FIGS. 11A to 11C, the second three-phase inverters TIV21 to TIV2$n$ and the third three-phase inverters TIV31 to TIV3$n$ may correspond to each other, and one of the corresponding second three-phase inverter and the corresponding third three-phase inverter may be turned on.

Figure 12:
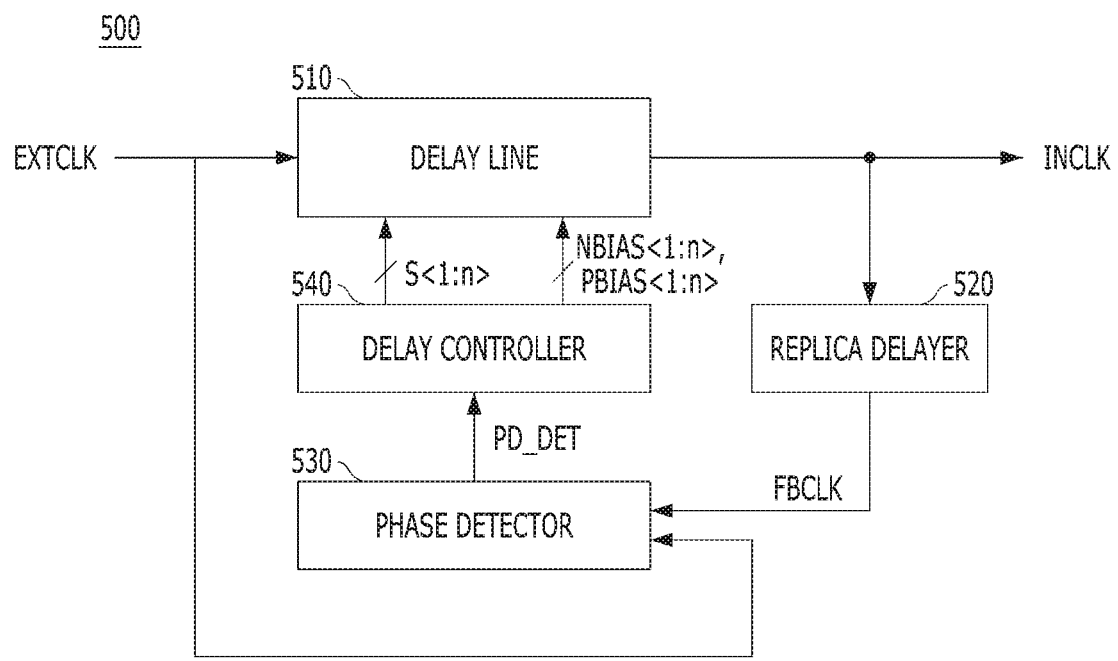
FIG. 12 is a block diagram illustrating a delay locked loop circuit including a delay line in accordance with an embodiment of the present invention.

FIG. 12 is a block diagram illustrating a delay locked loop (DLL) circuit 500 including a delay line in accordance with an embodiment of the present invention.

Referring to FIG. 12, the delay locked loop circuit 500 may include a delay line 510, a replica delayer 520, a phase detector 530, and a delay controller 540.

The delay line 510 may include a plurality of unit delays, and output a delay clock INCLK by selecting the number of unit delays to be used based on the delay control signals S<1:$n$> and delaying an external clock EXTCLK for a set time. The delay line 510 may control the driving force of at least one delay element of the unit delays that are selected based on the first bias voltages NBIAS<1:$n$> and the second bias voltages PBIAS<1:$n$>. The delay line 510 may have substantially the same structure as the delay line 300 shown in FIG. 8.

The replica delayer 520 may be a circuit formed to have the same delay condition as an actual clock path (which is also referred to as a tAC path) through which the delay clock INCLK is transferred to the final data output terminal of the semiconductor device. The replica delayer 520 may receive the delay clock INCLK and generate a feedback clock FBCLK. The feedback clock FBCLK may have the same phase as that of the clock transferred to the final data output terminal of the semiconductor device.

The phase detector 530 may generate a phase comparison signal PD_DET by comparing the phase of the external clock EXTCLK and the phase of the feedback clock FBCLK with each other.

The delay control unit 540 may include a plurality of delay control signals S<1:n> for selecting the number of the unit delays that are used in the delay line 510 based on the phase comparison signal PD_DET inputted from the phase detector 530. According to an embodiment of the present invention, the delay controller 540 may include the structure of the voltage compensation circuit 400 of FIG. 9. In other words, the delay controller 540 may generate a plurality of first bias voltages NBIAS<1:n> for compensating for the variation of the power source voltage VDD and generate a plurality of second bias voltages PBIAS<1:n> for compensating for the variation of the ground voltage VSS based on the delay control signals S<1:n>.

With the structure, the delay locked loop circuit 500 may adjust the delay amount of the delay clock INCLK so that the phase of the clock signal used in the final data input/output terminal of the semiconductor device is synchronized with the external clock EXTCLK. Herein, the delay locked loop circuit 500 in accordance with an embodiment of the present invention may suppress the generation of jitter by compensating the driving force that varies as the voltage levels of the power source voltage VDD and the ground voltage VSS are changed.

According to embodiments of the present invention, since delay lines and a delay line including the delay cells are robust to power noise, it is possible to more precisely control the delay time of an input signal.

While various embodiments of the present invention have been illustrated and described, it will be apparent to those skilled in the art in light of the present disclosure that various changes and modifications may be made without departing from the spirit and scope of the invention as defined in the following claims.

For example, the logic gates and transistors illustrated in the above embodiments may be realized in different positions and types according to the polarity of input signals.

What is claimed is:

1. A delay cell comprising:
a plurality of delay elements coupled in series; and
at least one three-phase inverter that is coupled in parallel with at least one of the delay elements, and that receives through a first control terminal a first bias voltage for moving in a direction opposite to the variation of a power source voltage to compensate for a variation of the power source voltage, and receives through a second control terminal a second bias voltage for moving in a direction opposite to the variation of a ground voltage to compensate for a variation of the ground voltage.

2. The delay cell of claim 1, further comprising:
a voltage generation circuit suitable for generating the first bias voltage by amplifying the variation of the power source voltage with respect to a first reference voltage at a first ratio, and generating the second bias voltage by amplifying the variation of the ground voltage with respect to a second reference voltage at a second ratio.

3. The delay cell of claim 2, wherein the voltage generation circuit includes:
a first operational amplifier suitable for receiving the first reference voltage through a positive (+) terminal and outputting the first bias voltage through an output terminal;
a first resistor coupled between a power source voltage terminal and a negative (−) terminal of the first operational amplifier;
a second resistor coupled between the negative (−) terminal of the first operational amplifier and the output terminal of the first operational amplifier;
a second operational amplifier suitable for receiving the second reference voltage through a positive (+) terminal and outputting the second bias voltage through an output terminal;
a third resistor coupled between a ground voltage terminal and a negative (−) terminal of the second operational amplifier; and
a fourth resistor coupled between the negative (−) terminal of the second operational amplifier and the output terminal of the second operational amplifier.

4. The delay cell of claim 1, wherein the three-phase inverter includes:
first to fourth transistors that are coupled in series between a power source voltage terminal and a ground voltage terminal,
wherein a gate of the first transistor receives the second bias voltage, and a gate of the fourth transistor receives the first bias voltage, and gates of the second and third transistors are coupled to an input terminal of a corresponding delay element, and drains of the second and third transistors are coupled to an output terminal of the corresponding delay element.

5. The delay cell of claim 1, wherein the delay elements include:
a first delay element suitable for delaying an input signal;
a second delay element suitable for delaying an output of the first delay element based on a delay control signal; and
a third delay element suitable for delaying an output of the second delay element.

6. The delay cell of claim 5, wherein the three-phase inverter is coupled in parallel with at least one between the first delay element and the third delay element.

7. A delay line comprising:
a plurality of first delay elements coupled in series and suitable for receiving an input signal based on a plurality of delay control signals;
a plurality of second delay elements coupled in series and suitable for outputting an output signal;
a plurality of third delay elements suitable for coupling the first delay elements and the second delay elements to each other based on the delay control signals; and
a plurality of first three-phase inverters that are coupled in parallel with the first delay elements, and that receive through first control terminals a plurality of first bias voltages for compensating for a variation of a power source voltage, and receive through second control terminals a plurality of second bias voltages for compensating for a variation of a ground voltage.

8. The delay line of claim 7,
wherein the first bias voltages move in a direction opposite to the variation of the power source voltage, and wherein the second bias voltages move in a direction opposite to the variation of the ground voltage.

9. The delay line of claim 7, further comprising: a voltage compensation circuit suitable for generating the first bias voltages and generating the second bias voltages based on the delay control signals.

10. The delay line of claim 9, wherein the voltage compensation circuit includes:
a voltage generation circuit suitable for generating a first bias voltage by amplifying the variation of the power source voltage with respect to a first reference voltage at a first ratio, and generating the second bias voltage by amplifying the variation of the ground voltage with respect to a second reference voltage at a second ratio; and
a voltage output circuit suitable for transferring the first bias voltage as at least one among the first bias voltages and transferring the second bias voltage as at least one among the second bias voltages based on the delay control signals.

11. The delay line of claim 10, wherein the voltage generation circuit includes:
a first operational amplifier suitable for receiving the first reference voltage through a positive (+) terminal and outputting the first bias voltage through an output terminal;
a first resistor coupled between a power source voltage terminal and a negative (−) terminal of the first operational amplifier;
a second resistor coupled between the negative (−) terminal of the first operational amplifier and the output terminal of the first operational amplifier;
a second operational amplifier suitable for receiving the second reference voltage through a positive (+) terminal and outputting the second bias voltage through an output terminal;
a third resistor coupled between a ground voltage terminal and a negative (−) terminal of the second operational amplifier; and
a fourth resistor coupled between the negative (−) terminal of the second operational amplifier and the output terminal of the second operational amplifier.

12. The delay line of claim 10, wherein the voltage output circuit includes:
a first voltage output unit suitable for selecting the first bias voltage or the ground voltage based on the delay control signals and outputting the first bias voltages; and
a second voltage output unit suitable for selecting the second bias voltage or the power source voltage based on the delay control signals and outputting the second bias voltages.

13. The delay line of claim 7, wherein each of the three-phase inverters includes:
first to fourth transistors that are coupled in series between a power source voltage terminal and a ground voltage terminal,
wherein a gate of the first transistor receives one among the first bias voltages, and a gate of the fourth transistor receives one among the second bias voltages, and gates of the second and third transistors are coupled to an input terminal of a corresponding delay element, and drains of the second and third transistors are coupled to an output terminal of the corresponding delay element.

14. The delay line of claim 7, wherein each of the second delay elements is formed of a logic gate that receives an output of a preceding stage through a first input terminal and receives an output of a corresponding third delay element among the third delay elements through a second input terminal.

15. The delay line of claim 14, further comprising:
a plurality of second three-phase inverters that are coupled in parallel between the first input terminal and the output terminal of the second delay elements, and receive the first bias voltages through a first control terminal and receive the second bias voltages through a second control terminal.

16. The delay line of claim 15, further comprising:
a plurality of third three-phase inverters that are coupled in parallel between the second input terminal and the output terminal of the second delay elements, and turned on/off based on the delay control signals.

17. The delay line of claim 16, wherein the second three-phase inverters and the third three-phase inverters correspond to each other, and only one between a corresponding second three-phase inverter and a corresponding third three-phase inverter is turned on.

18. A delay locked loop circuit comprising:
a delay line suitable for selecting unit delays to be used based on a plurality of delay control signals, delaying an external clock, and outputting a delay clock, and controlling a driving force of the unit delays based on a first bias voltage and a second bias voltage, wherein each of the unit delays includes a delay element and a three-phase inverter coupled in parallel with the delay element and operable based on the first and second bias voltages;
a replica delayer suitable for receiving the delay clock and generating a feedback clock by reflecting a delay amount of an actual clock path;
a phase detector suitable for generating a phase comparison signal by comparing a phase of the external clock and a phase of the feedback clock with each other; and
a delay controller suitable for generating the delay control signals based on the phase comparison signal, and generating the first bias voltage that moves in a direction opposite to the variation of a power source voltage to compensate for a variation of the power source voltage and generating the second bias voltage that moves in a direction opposite to the variation of a ground voltage to compensate for a variation of the ground voltage, based on the delay control signals.

19. The delay locked loop circuit of claim 18, wherein the delay controller includes:
a voltage generation circuit suitable for generating the first bias voltage by amplifying the variation of the power source voltage with respect to a first reference voltage at a first ratio, and generating the second bias voltage by amplifying the variation of the ground voltage with respect to a second reference voltage at a second ratio.

20. A delay cell comprising:
a first voltage generator configured to generate a first bias voltage moving in a direction opposite to the variation of a first source voltage to compensate for variation in the first source voltage;
a second voltage generator configured to generate a second bias voltage moving in a direction opposite to the variation of a second source voltage to compensate for variation in the second source voltage;
a delay element operable based on the first and second source voltages; and a three-phase inverter coupled in parallel with the delay element and operable based on the first and second bias voltages.

21. A delay line comprising:
a first voltage generator configured to generate a first bias voltage moving in a direction opposite to the variation of a first source voltage to compensate for variation in the first source voltage;
a second voltage generator configured to generate a second bias voltage moving in a direction opposite to the variation of a second source voltage to compensate for variation in the second source voltage; and
plural delay cells coupled to one another,
   wherein at least one delay cell among the delay cells includes:
   a delay element operable based on the first and second source voltages; and
   a three-phase inverter coupled in parallel with the delay element and operable based on the first and second bias voltages.

22. A delay locked loop circuit comprising:
a control circuit configured to generate a first bias voltage moving in a direction opposite to the variation of a first source voltage to compensate for variation in the first source voltage, and a second bias voltage moving in a direction opposite to the variation of a second source voltage to compensate for variation in the second source voltage, based on an external clock and a delay clock; and
a delay line including at least one delay cell and configured to delay the external clock to generate the delay clock,
wherein the delay cell includes:
   a delay element operable based on the first and second source voltages; and
   a three-phase inverter coupled in parallel with the delay element and operable based on the first and second bias voltages.

* * * * *